United States Patent
Geissinger (10) Patent No.: US 10,642,841 B2
(45) Date of Patent: May 5, 2020

(54) DOCUMENT STORE UTILIZING PARTIAL OBJECT COMPRESSION

(71) Applicant: SAP SE, Walldorf (DE)

(72) Inventor: Steffen Geissinger, Weisloch (DE)

(73) Assignee: SAP SE, Walldorf (DE)

( * ) Notice: Subject to any disclaimer, the term of this patent is extended or adjusted under 35 U.S.C. 154(b) by 271 days.

(21) Appl. No.: 15/354,807

(22) Filed: Nov. 17, 2016

(65) Prior Publication Data

US 2018/0137176 A1    May 17, 2018

(51) Int. Cl.
*G06F 16/00* (2019.01)
*G06F 16/2455* (2019.01)
*G06F 16/28* (2019.01)
*H03M 7/30* (2006.01)
*G06F 16/93* (2019.01)

(52) U.S. Cl.
CPC ...... *G06F 16/24561* (2019.01); *G06F 16/284* (2019.01); *G06F 16/93* (2019.01); *H03M 7/30* (2013.01); *H03M 7/3088* (2013.01); *H03M 7/707* (2013.01)

(58) Field of Classification Search
CPC ...... H04L 63/20; H04N 19/70; H04N 19/176; H04N 19/44; H04W 72/042; G06F 21/602; G06F 3/0619; G06F 3/065
See application file for complete search history.

(56) References Cited

U.S. PATENT DOCUMENTS

| | | | | |
|---|---|---|---|---|
| 4,868,570 A * | 9/1989 | Davis | | H03M 7/42 341/106 |
| 5,897,641 A * | 4/1999 | Ruddy | | G06F 17/30368 707/672 |
| 6,263,331 B1 * | 7/2001 | Liu | | G06F 16/24552 |
| 6,523,102 B1 * | 2/2003 | Dye | | G06F 12/023 709/247 |
| 7,818,728 B1 * | 10/2010 | Olson | | G06F 17/30501 707/693 |
| 9,507,762 B1 * | 11/2016 | Lashley | | G06F 17/30 |
| 9,712,830 B1 * | 7/2017 | Horn | | H04N 19/176 |
| 2004/0249793 A1 * | 12/2004 | Both | | G06F 17/30011 |

(Continued)

FOREIGN PATENT DOCUMENTS

| CN | 103026631 B * | 7/2017 | ....... G06F 17/30914 |
|---|---|---|---|
| EP | 1837782 A1 * | 9/2007 | ....... G06F 17/30646 |
| EP | 2350881 A2 * | 8/2011 | ......... G06F 17/3048 |

OTHER PUBLICATIONS

Daniel J. Abadi, Query Execution in Column-Oriented Database Systems, pp. 56-92 (Year: 2008).*

*Primary Examiner* — Mark D Featherstone
*Assistant Examiner* — Kwenku William Halm
(74) *Attorney, Agent, or Firm* — Jones Day (57) ABSTRACT

A query is received by a document store from a client. The query specifies at least one database operation implicating documents within the document store. At least one of the implicated documents has partially compressed objects in which only a portion of the document is compressed. Thereafter, the documents are scanned to identify the compressed objects and to identify decompression keys. The scanned compressed objects are then decompressed using the corresponding decompression keys. Data responsive to the query can then be provided to the client. lated apparatus, systems, techniques and articles are also described.

20 Claims, 8 Drawing Sheets

(56) References Cited

U.S. PATENT DOCUMENTS

| | | | |
|---|---|---|---|
| 2007/0208741 A1* | 9/2007 | Vishwanath | G06Q 20/10 |
| 2011/0320417 A1* | 12/2011 | Luo | G06F 17/30312 |
| | | | 707/693 |
| 2013/0191352 A1* | 7/2013 | Barsness | G06F 17/30442 |
| | | | 707/693 |
| 2015/0032757 A1* | 1/2015 | Barykin | G06F 17/30321 |
| | | | 707/741 |
| 2016/0299924 A1* | 10/2016 | Fujimoto | G06F 21/6227 |
| 2017/0126246 A1* | 5/2017 | Strohm, III | H03M 7/3059 |
| 2018/0260469 A1* | 9/2018 | Paris | G06F 17/30598 |

* cited by examiner

DOCUMENT STORE UTILIZING PARTIAL OBJECT COMPRESSION

TECHNICAL FIELD

The subject matter described herein relates to a database system having a document store utilizing partial object compression to store documents therein.

BACKGROUND

Companies continue to generate increasingly larger amounts of data year over year. Rapid and convenient access to such data by a large number of concurrent users can present problems. For example, a company may store data across multiple databases of varying types which may be distributed amongst various computing nodes. These types can vary differently such as the manner in which data is stored, structured, and accessed. Typical computing architectures require separate and distinct queries to access data within the respective database types.

SUMMARY

In one aspect, a query is received by a document store from a client. The query specifies at least one database operation implicating documents within the document store. At least one of the implicated documents has partially compressed objects in which only a portion of the document is compressed. Thereafter, the documents are scanned to identify the compressed objects and to identify decompression keys. The scanned compressed objects are then decompressed using the corresponding decompression keys. Data responsive to the query can then be provided to the client.

There can be a first database and a second database with the second database comprising the document store. The query can implicate data in both of the first database and the second database. A plurality of transactions responsive to the query can be initiated to access the data within the first database and the second database. Execution of the plurality of transactions can be coordinated between the first database and the second database. All changes specified by the at least one database operation can be persisted in the first database including changes implicating data stored within the second database. The first database can be an in-memory relational database and the second database can be a database storing data on physical disk storage. The document store can store a collection of documents in JavaScript Object Notation (JSON) format.

Non-transitory computer program products (i.e., physically embodied computer program products) are also described that store instructions, which when executed by one or more data processors of one or more computing systems, cause at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, the current subject matter is advantageous in that it allows for more efficient storage of documents within a document store. In addition, the current subject matter enables a single query to access/manipulate data within different database types (e.g., disk-based databases and in-memory database, etc.) including a document store. In addition, the current subject matter permits the management of transactions specified by such queries across different database types that typically would require complex coordination and/or separately processed transactions.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

Like reference symbols in the various drawings indicate like elements.

DETAILED DESCRIPTION

The current subject matter is directed to the interplay among two or more databases when concurrently executing multiple transactions in which one of the databases is a document store. In some variations, a first database acts as a master database and the other acts as a slave database with regard to transaction management. In some implementations, both databases are relational databases; however, they can differ in the manner in which they store data. For example, one database can be disk-based while the other database can be an in-memory database storing data in main memory.

Figure 1:
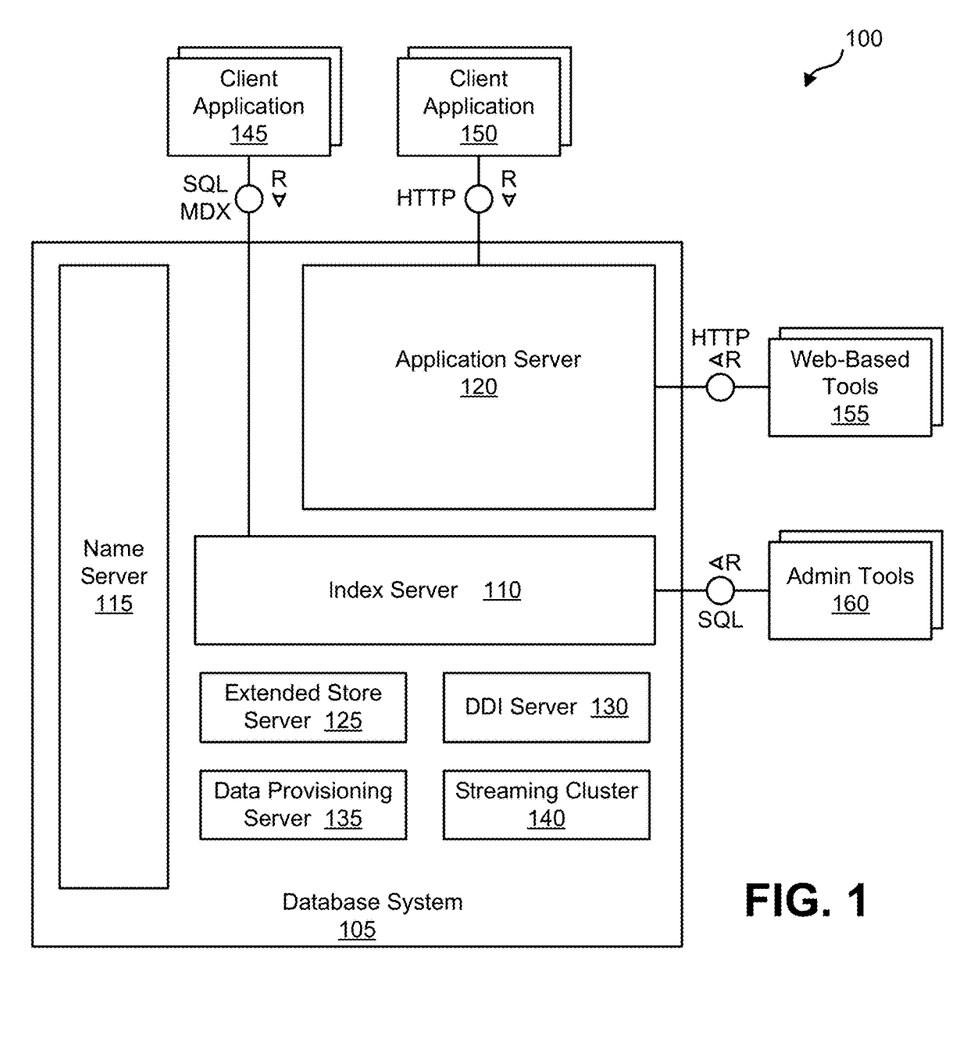
FIG. 1 is a system diagram illustrating an example database system for use in connection with the current subject matter.

FIG. 1 is a diagram 100 illustrating a database system 105 that can be used to implement aspects of the current subject matter. The database system 105 can, for example, be an in-memory database in which all relevant data is kept in main memory so that read operations can be executed without disk I/O and in which disk storage is required to make any changes durables. The database system 105 can include a plurality of servers including, for example, one or more of an index server 110, a name server 115, and/or an application server 120. The database system 105 can also include one or more of an extended store server 125, a database deployment infrastructure (DDI) server 130, a data provisioning server 135, and/or a streaming cluster 140. The database system 105 can be accessed by a plurality of remote clients 145, 150 via different protocols such as SQL/MDX (by way of the index server 110) and/or web-based protocols such as HTTP (by way of the application server 120).

The index server 110 can contain in-memory data stores and engines for processing data. The index server 110 can also be accessed by remote tools (via, for example, SQL queries), that can provide various development environment and administration tools. Additional details regarding an example implementation of the index server 110 is described and illustrated in connection with diagram 300 of FIG. 3.

The name server 115 can own information about the topology of the database system 105. In a distributed database system, the name server 115 can know where various components are running and which data is located on which server. In a database system 105 with multiple database containers, the name server 115 can have information about existing database containers and it can also host the system database. For example, the name server 115 can manage the information about existing tenant databases. Unlike a name server 115 in a single-container system, the name server 115 in a database system 105 having multiple database containers does not store topology information such as the location of tables in a distributed database. In a multi-container database system 105 such database-level topology information can be stored as part of the catalogs of the tenant databases.

The application server 120 can enable native web applications used by one or more remote clients 150 accessing the database system 105 via a web protocol such as HTTP. The application server 120 can allow developers to write and run various database applications without the need to run an additional application server. The application server 120 can also used to run web-based tools 155 for administration, life-cycle management and development. Other administration and development tools 160 can directly access the index server 110 for, example, via SQL and other protocols.

The extended store server 125 can be part of a dynamic tiering option that can include a high-performance disk-based column store for very big data up to the petabyte range and beyond. Less frequently accessed data (for which is it non-optimal to maintain in main memory of the index server 110) can be put into the extended store server 125. The dynamic tiering of the extended store server 125 allows for hosting of very large databases with a reduced cost of ownership as compared to conventional arrangements.

The DDI server 130 can be a separate server process that is part of a database deployment infrastructure (DDI). The DDI can be a layer of the database system 105 that simplifies the deployment of database objects using declarative design time artifacts. DDI can ensure a consistent deployment, for example by guaranteeing that multiple objects are deployed in the right sequence based on dependencies, and by implementing a transactional all-or-nothing deployment.

The data provisioning server 135 can provide enterprise information management and enable capabilities such as data provisioning in real time and batch mode, real-time data transformations, data quality functions, adapters for various types of remote sources, and an adapter SDK for developing additional adapters.

The streaming cluster 140 allows for various types of data streams (i.e., data feeds, etc.) to be utilized by the database system 105. The streaming cluster 140 allows for both consumption of data streams and for complex event processing.

Figure 2:
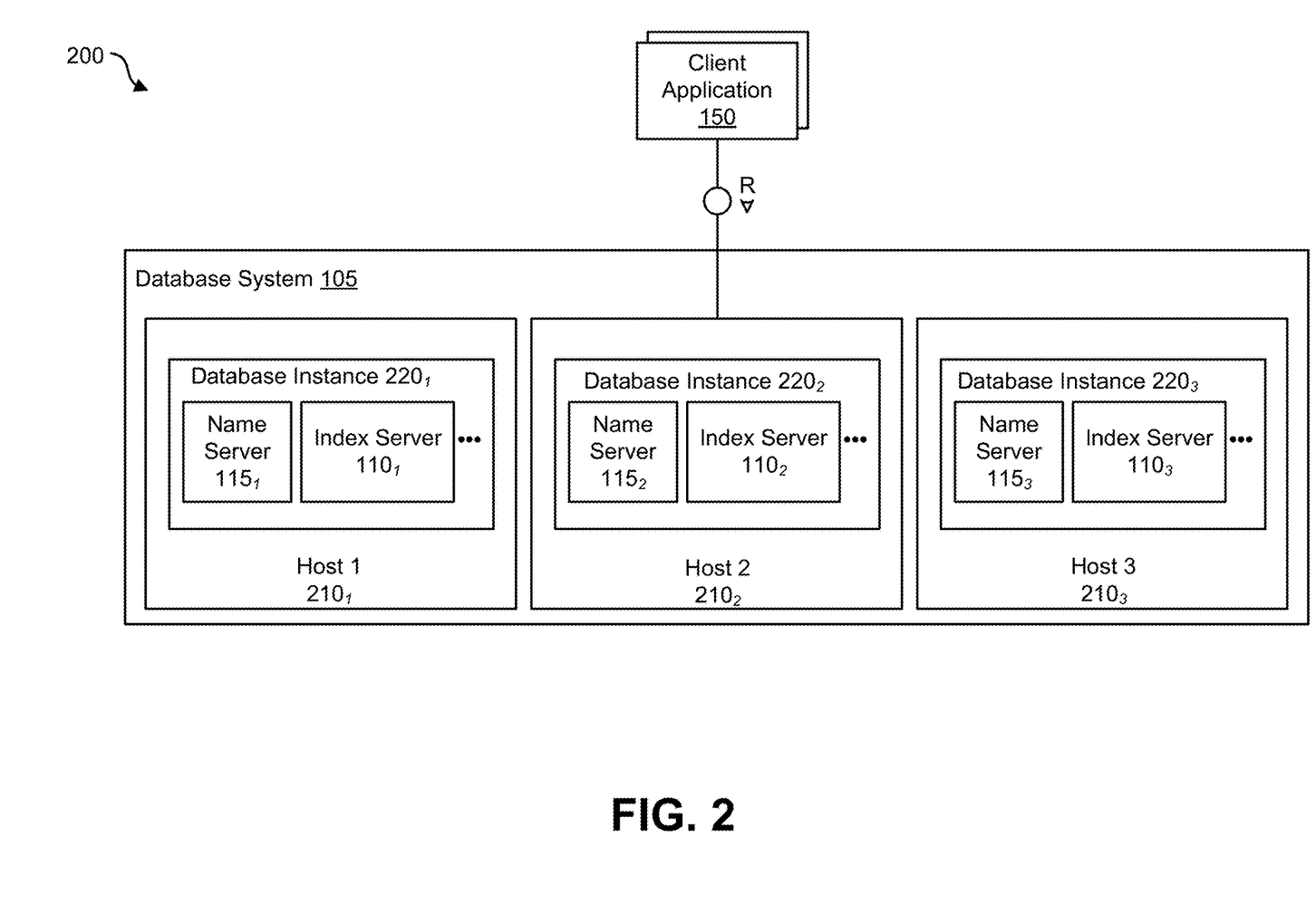
FIG. 2 is a system diagram illustrating a distributed database system having a plurality of database instances.

FIG. 2 is a diagram 200 illustrating a variation of the database system 105 that can support distribution of server components across multiple hosts for scalability and/or availability purposes. This database system 105 can, for example, be identified by a single system ID (SID) and it is perceived as one unit from the perspective of an administrator, who can install, update, start up, shut down, or backup the system as a whole. The different components of the database system 105 can share the same metadata, and requests from client applications 230 can be transparently dispatched to different servers $110_{1-3}$, $120_{1-3}$, in the system, if required.

As is illustrated in FIG. 2, the distributed database system 105 can be installed on more than one host $210_{1-3}$. Each host $210_{1-3}$ is a machine that can comprise at least one data processor (e.g., a CPU, etc.), memory, storage, a network interface, and an operation system and which executes part of the database system 105. Each host $210_{1-3}$ can execute a database instance $220_{1-3}$ which comprises the set of components of the distributed database system 105 that are installed on one host $210_{1-3}$. FIG. 2 shows a distributed system with three hosts, which each run a name server $110_{1-3}$, index server $120_{1-3}$, and so on (other components are omitted to simplify the illustration).

Figure 3:
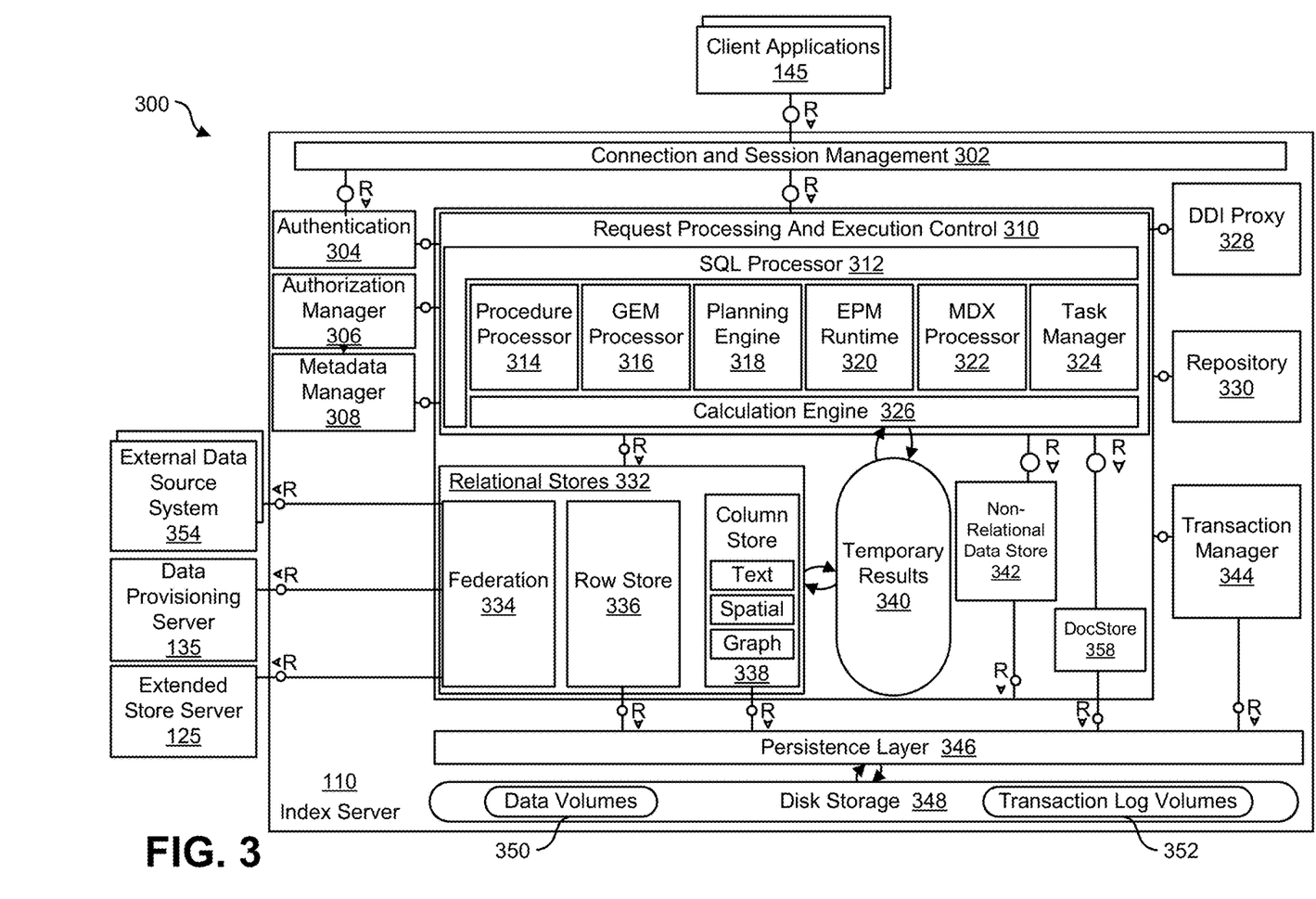
FIG. 3 is a system diagram of an index server forming part of the database system of FIG. 1.

FIG. 3 is a diagram 300 illustrating an architecture for the index server 110 (which can, as indicated above, be one of many instances). A connection and session management component 302 can create and manage sessions and connections for the client applications 145. For each session, a set of parameters can be maintained such as, for example, auto commit settings or the current transaction isolation level.

Requests from the client applications 145 can be processed and executed by way of a request processing and execution control component 310. The database system 105 offers rich programming capabilities for running application-specific calculations inside the database system. In addition to SQL, MDX, and WIPE, the database system 105 can provide different programming languages for different use cases. SQLScript can be used to write database procedures and user defined functions that can be used in SQL statements. The L language is an imperative language, which can be used to implement operator logic that can be called by SQLScript procedures and for writing user-defined functions.

Once a session is established, client applications 145 typically use SQL statements to communicate with the index server 110 which can be handled by a SQL processor 312 within the request processing and execution control component 310. Analytical applications can use the multidimensional query language MDX (MultiDimensional eXpressions) via an MDX processor 322. For graph data, applications can use GEM (Graph Query and Manipulation) via a GEM processor 316, a graph query and manipulation language. SQL statements and MDX queries can be sent over the same connection with the client application 145 using the same network communication protocol. GEM statements can be sent using a built-in SQL system procedure.

The index server 110 can include an authentication component 304 that can be invoked with a new connection with a client application 145 is established. Users can be authenticated either by the database system 105 itself (login with user and password) or authentication can be delegated to an external authentication provider. An authorization manager 306 can be invoked by other components of the database system 145 to check whether the user has the required privileges to execute the requested operations.

Each statement can processed in the context of a transaction. New sessions can be implicitly assigned to a new transaction. The index server 110 can include a transaction manager 344 that coordinates transactions, controls transactional isolation, and keeps track of running and closed transactions. When a transaction is committed or rolled back, the transaction manager 344 can inform the involved engines about this event so they can execute necessary actions. The transaction manager 344 can provide various types of concurrency control and it can cooperate with a persistence layer 346 to achieve atomic and durable transactions.

Incoming SQL requests from the client applications 145 can be received by the SQL processor 312. Data manipulation statements can be executed by the SQL processor 312 itself. Other types of requests can be delegated to the respective components. Data definition statements can be dispatched to a metadata manager 306, transaction control statements can be forwarded to the transaction manager 344, planning commands can be routed to a planning engine 318, and task related commands can forwarded to a task manager 324 (which can be part of a larger task framework) Incoming MDX requests can be delegated to the MDX processor 322. Procedure calls can be forwarded to the procedure processor 314, which further dispatches the calls, for example to a calculation engine 326, the GEM processor 316, a repository 300, or a DDI proxy 328.

The index server 110 can also include a planning engine 318 that allows planning applications, for instance for financial planning, to execute basic planning operations in the database layer. One such basic operation is to create a new version of a data set as a copy of an existing one while applying filters and transformations. For example, planning data for a new year can be created as a copy of the data from the previous year. Another example for a planning operation is the disaggregation operation that distributes target values from higher to lower aggregation levels based on a distribution function.

The SQL processor 312 can include an enterprise performance management (EPM) runtime component 320 that can form part of a larger platform providing an infrastructure for developing and running enterprise performance management applications on the database system 105. While the planning engine 318 can provide basic planning operations, the EPM platform provides a foundation for complete planning applications, based on by application-specific planning models managed in the database system 105.

The calculation engine 326 can provide a common infrastructure that implements various features such as SQLScript, MDX, GEM, tasks, and planning operations. The SQLScript processor 312, the MDX processor 322, the planning engine 318, the task manager 324, and the GEM processor 316 can translate the different programming languages, query languages, and models into a common representation that is optimized and executed by the calculation engine 326. The calculation engine 326 can implement those features using temporary results 340 which can be based, in part, on data within the relational stores 332.

Metadata can be accessed via the metadata manager component 308. Metadata, in this context, can comprise a variety of objects, such as definitions of relational tables, columns, views, indexes and procedures. Metadata of all these types can be stored in one common database catalog for all stores. The database catalog can be stored in tables in a row store 336 forming part of a group of relational stores 332. Other aspects of the database system 105 including, for example, support and multi-version concurrency control can also be used for metadata management. In distributed systems, central metadata is shared across servers and the metadata manager 308 can coordinate or otherwise manage such sharing.

The relational stores 332 form the different data management components of the index server 110 and these relational stores can, for example, store data in main memory. The row store 336, a column store 338, and a federation component 334 are all relational data stores which can provide access to data organized in relational tables. The column store 338 can store relational tables column-wise (i.e., in a column-oriented fashion, etc.). The column store 338 can also comprise text search and analysis capabilities, support for spatial data, and operators and storage for graph-structured data. With regard to graph-structured data, from an application viewpoint, the column store 338 could be viewed as a non-relational and schema-flexible in-memory data store for graph-structured data. However, technically such a graph store is not a separate physical data store. Instead it is built using the column store 338, which can have a dedicated graph API.

The row store 336 can store relational tables row-wise. When a table is created, the creator can specify whether it should be row or column-based. Tables can be migrated between the two storage formats. While certain SQL extensions are only available for one kind of table (such as the "merge" command for column tables), standard SQL can be used on all tables. The index server 110 also provides functionality to combine both kinds of tables in one statement (join, sub query, union).

The federation component 334 can be viewed as a virtual relational data store. The federation component 334 can provide access to remote data in external data source system(s) 354 through virtual tables, which can be used in SQL queries in a fashion similar to normal tables.

The database system 105 can include an integration of a non-relational data store 342 into the index server 110. For example, the non-relational data store 342 can have data represented as networks of C++ objects, which can be persisted to disk. The non-relational data store 342 can be used, for example, for optimization and planning tasks that operate on large networks of data objects, for example in supply chain management. Unlike the row store 336 and the column store 338, the non-relational data store 342 does not use relational tables; rather, objects can be directly stored in containers provided by the persistence layer 346. Fixed size entry containers can be used to store objects of one class. Persisted objects can be loaded via their persisted object IDs, which can also be used to persist references between objects. In addition, access via in-memory indexes is supported. In that case, the objects need to contain search keys. The in-memory search index is created on first access. The non-relational data store 342 can be integrated with the transaction manager 344 to extends transaction management with sub-transactions, and to also provide a different locking protocol and implementation of multi version concurrency control.

Furthermore, the database system 105 can include a document store (DocStore) 358. In some arrangements, the DocStore 358 is external to the database system 105. In either arrangement, the DocStore 358 is in communication with the index server 125. The DocStore 358 is a document-oriented data store for storing, retrieving, and managing document oriented/semi-structured data (referred to herein as documents). The documents within the DocStore 358 can encapsulate and encode data in various formats such as, for example, Extensible Markup Language (XML), YAML, JavaScript Object Notation (JSON), B SON, and the like. For illustration purposes (unless otherwise specified), references are made herein of the DocStore 358 comprising a collection of JSON documents. The DocStore 358 can store the documents in physical persistence such as disk storage and/or the documents can be loaded into main memory.

The client applications 145 can initiate various transactions that involve both data within the index server 110 (e.g., data stored in the relational store 332, the non-relational data store 342, disk storage 348, etc.) as well as data within the DocStore 358. Stated differently, the database system 105 can have the same or overlapping transaction boundaries with the DocStore 358 so that coordination is required amongst the various data sources. In an arrangement, the transaction manager 344 can be made the leading or dominant transaction manager so that transaction managing facilities of the DocStore 358 or another "slave" database can be channeled and managed by transaction manager 344. Documents within the DocStore 358 can be accessed or otherwise manipulated via various protocols. For example, client applications 145 can initiate various database manipulation language (DML) statements to select, insert, delete and update data encapsulated in documents within the DocStore 358. Similarly, the client applications 145 can initiate various data definition language (DDL) statements to create, drop, alter, and rename data encapsulated within documents within the DocStore 358. As a further example, the client applications 145 can use other protocols such as QL to retrieve data encapsulated within documents in the DocStore 358.

The DocStore 358 can comprise a persistence manager as well as a separate transaction manager. The persistence manager can cause data written into the DocStore to be written into the disk storage 348 (i.e., the persistence) of the database system 105. Despite the DocStore 358 being an independent database or data store with its own dedicated binary data format, the persistence 348 of the main database system 105 can be utilized. The transaction manager of the DocStore 358 can concurrently notify the transaction manager 344 of the index server 110 about the changes. The transaction manager 344 then oversees the commit of the data using a commit writer that assigns commit IDs to the data stored in the disk storage 348.

An extended store is another relational store that can be used or otherwise form part of the database system 105. The extended store can, for example, be a disk-based column store optimized for managing very big tables, which ones do not want to keep in memory (as with the relational stores 332). The extended store can run in an extended store server 125 separate from the index server 110. The index server 110 can use the federation component 334 to send SQL statements to the extended store server 125.

The persistence layer 346 is responsible for durability and atomicity of transactions. The persistence layer 346 can ensure that the database system 105 is restored to the most recent committed state after a restart and that transactions are either completely executed or completely undone. To achieve this goal in an efficient way, the persistence layer 346 can use a combination of write-ahead logs, shadow paging and savepoints. The persistence layer 346 can provide interfaces for writing and reading persisted data and it can also contain a logger component that manages a transaction log. Transaction log entries can be written explicitly by using a log interface or implicitly when using the virtual file abstraction.

The persistence layer 236 stores data in persistent disk storage 348 which, in turn, can include data volumes 350 and/or transaction log volumes 352 that can be organized in pages. Different page sizes can be supported, for example, between 4 k and 16 M. Data can be loaded from the disk storage 348 and stored to disk page wise. For read and write access, pages can be loaded into a page buffer in memory. The page buffer need not have a minimum or maximum size, rather, all free memory not used for other things can be used for the page buffer. If the memory is needed elsewhere, least recently used pages can be removed from the cache. If a modified page is chosen to be removed, the page first needs to be persisted to disk storage 348. While the pages and the page buffer are managed by the persistence layer 346, the in-memory stores (i.e., the relational stores 332) can access data within loaded pages.

In some cases, documents within the document store 358 can contain many values and some of them might take up some significant amount of space but are rarely accessed. As a result, the document store 358 can store documents according to a format that supports compression. In this case, the format can support partial object compression as provided below.

In some cases, the format employed by the document store 358 can be PJSON which as provided herein is a binary representation of the JavaScript Object Notation (JSON). PJSON can be used to transport data between the client applications 145, 150 and the index server 110 as well as the main storage format for all the data.

In the following example key and value are of type string:
{"key": "value"}

It's very common to store multiple PJSON documents which have the same or similar keys such as below:
{"age": 32, "name": "Maria", "city": "London"}
{"age": 47, "name": "Jane", "city": "Berlin"}
{"age": 53, "name": "Bill", "city": "New York"}

It can be seen that the strings for the keys ("age", "name", "city") are redundant data and could be stored more efficiently using a dictionary. Therefore, the documents can be stored in the following manner:
["age", "name", "city"]
{0: 32, 1: "Maria", 2: "London"}
{0: 47, 1: "Jane", 2: "Berlin"}
{0: 53, 1: "Bill", 2: "New York"}

Figure 4:
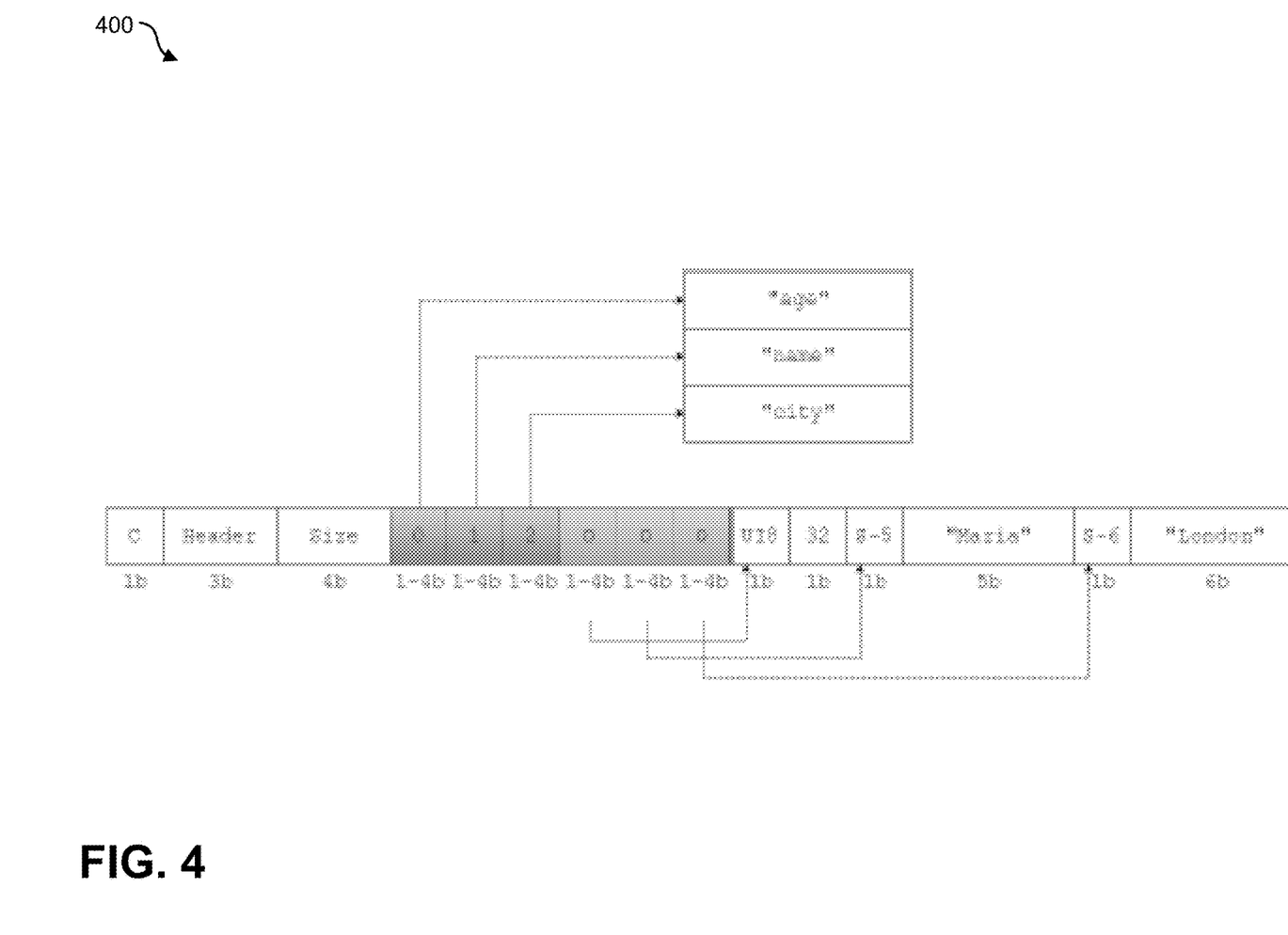
FIG. 4 is a diagram of an object to illustrate dictionary compression.

The first array is the dictionary and the keys in the object have been replaced by the corresponding dictionary index. Instead of using the string type for the keys, a ValueID type can be used which is basically identically to the length type and stores a compressed integer up to $2^{30-1}$ (which is the maximum size of the dictionary). Diagram 400 of FIG. 4 shows how the first document would be stored. The Dictionary is stored externally and not part of the PJSON format. The format only contains the Value IDs.

The first byte is the type marker and identifies a compressed object. The following three bytes contain header information:

2b: How many bytes are necessary to store the highest ValueID (1, 2, 3 or 4)

2b: How many bytes are necessary to store the highest offset value (1, 2, 3 or 4)

1b: Some internal marker

16b: Number of elements in the object

3b: reserved for future use

The size is the number of bytes used to store the entire object. After the size the ValueID Array follows. This array has as many elements as the object has elements. So in our example three. The size of each ValueID depends on the highest value for a ValueID. In our case the highest ValueID is 2 so only one byte is needed to store all ValueIDs, but when the dictionary becomes bigger we might have ValueIDs which need 2, 3 or 4 bytes to be stored. This is identified in the header. This case all ValueIDs will use as many bytes as we need for the highest ValueID.

After the ValueID array, an offset array is provided which has the same size as the ValueID array and will also use the same number of bytes for each entry. The size also depends again on the value for the highest offset and is identified in the header. A offset specifies how many bytes one have to add the a pointer, which points to the type marker at the beginning of the object, to get the address of the corresponding value. After the offset array we store the actual values in marker-value pairs.

To get the value for i.e. city in this document, the ValueID (2) is obtained from the dictionary. The header of the document can be checked to see how many bytes are used for the ValueIDs and offsets respectively. Then the ValueID array can be scanned to find the ValueID 2 (This is implemented by using SSE). ValueID 2 is found at position 2 of the ValueID array. The offset at position 2 is then read from the offset array and then it is added to the beginning of the document to calculate a pointer which points to the value of city.

Consider the document below which contains one huge string value which is rarely accessed:

"name": "Maria", "data": "< . . . a huge string . . . >", "image": "< . . . base64 encoded image . . . >"

There are two different ways of compressing this document.

Figure 5:
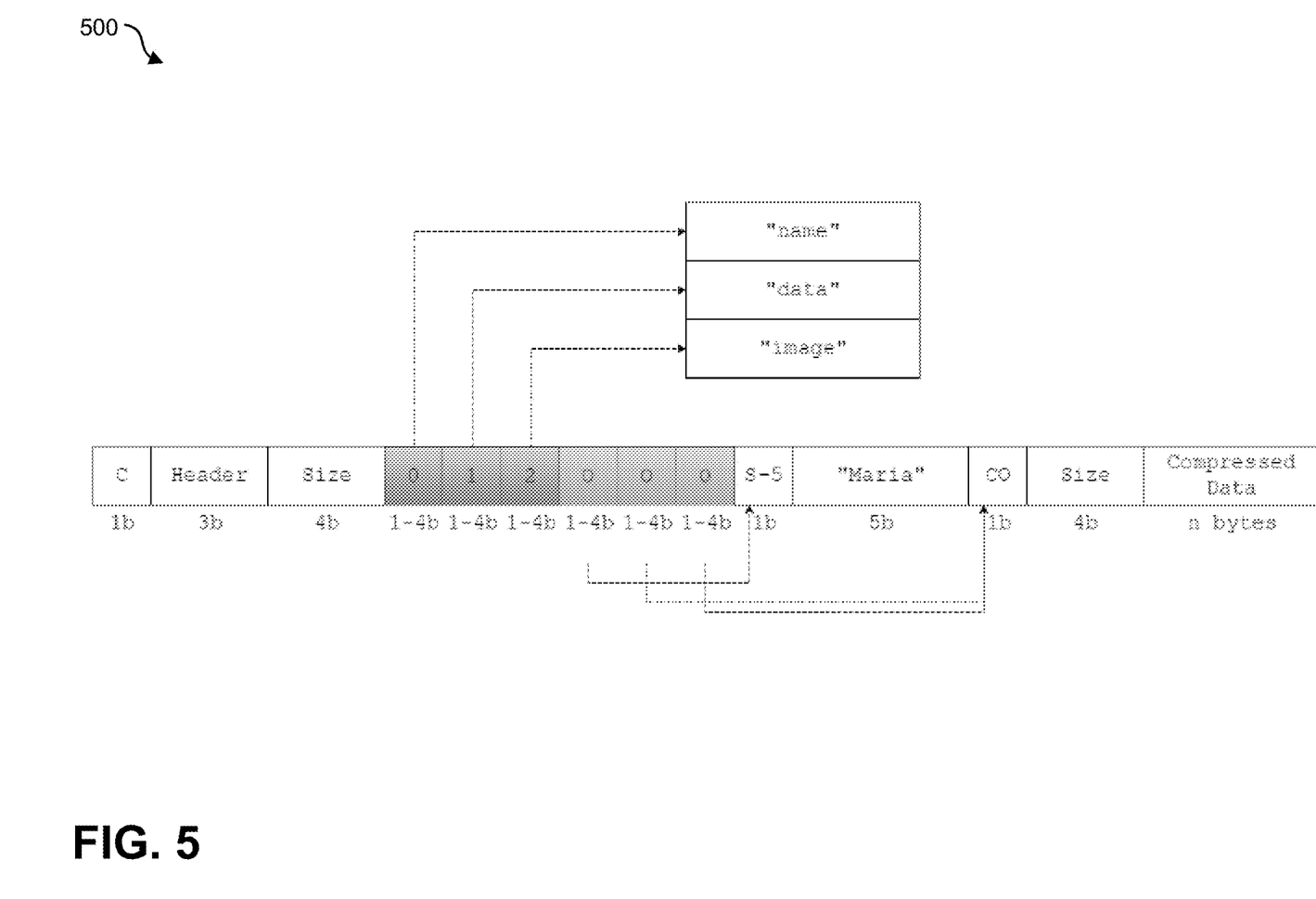
FIG. 5 is a first diagram of an object to illustrate partial object compression.

The diagram 500 of FIG. 5 illustrates partial object compression when the data and the image are combined into one compressed data part. As can be seen, the combined data and image appear similar to any other dictionary compressed object. However, one significant difference is that multiple offsets can point to the same compressed data part. This situation is the case for both the data and the image because they are both compressed.

The compressed data part is a second dictionary compressed object which has been compressed by a common compression algorithm (e.g., snappy, zip, etc.). If the compressed data part is uncompressed again, it would be illustrated such as in diagram 600 of FIG. 6. With the arrangement of FIG. 6, every element that should be compressed is put into a regular second object, which is then compressed with a compression algorithm and put into as a value into the outer object which additionally contains all other uncompressed elements.

Figure 6:
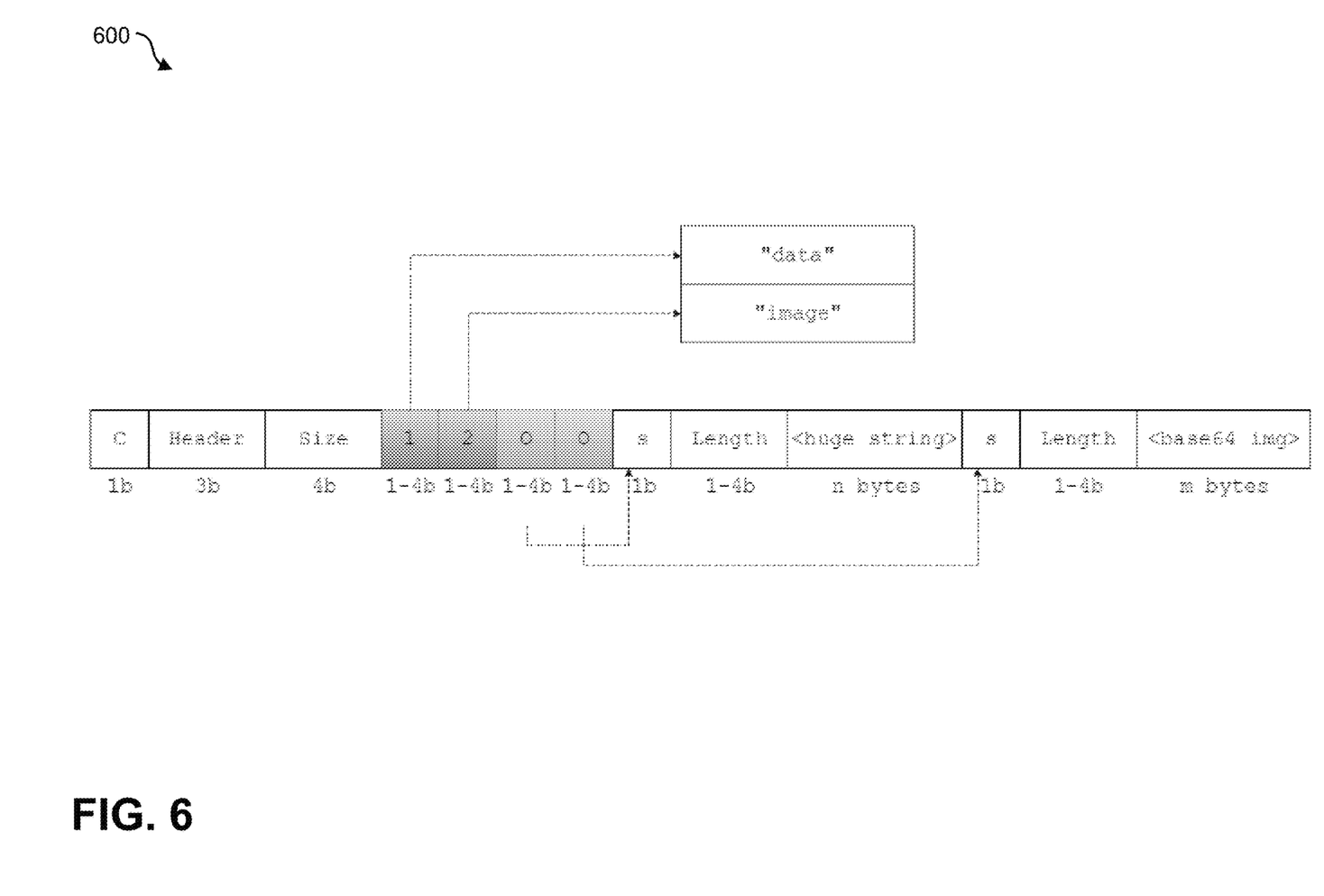
FIG. 6 is a second diagram of an object to illustrate partial object compression.

The outer object still has offsets (i.e., offset from the beginning of the object, etc.) for each element, even the compressed elements. So it is still possible to check if a key really exists in an object by scanning a corresponding ValueID array. If a compressed value needs to be accessed (i.e., image, etc.), the compressed data needs to be decompressed so that an image can be searched for in the inner object.

Figure 7:
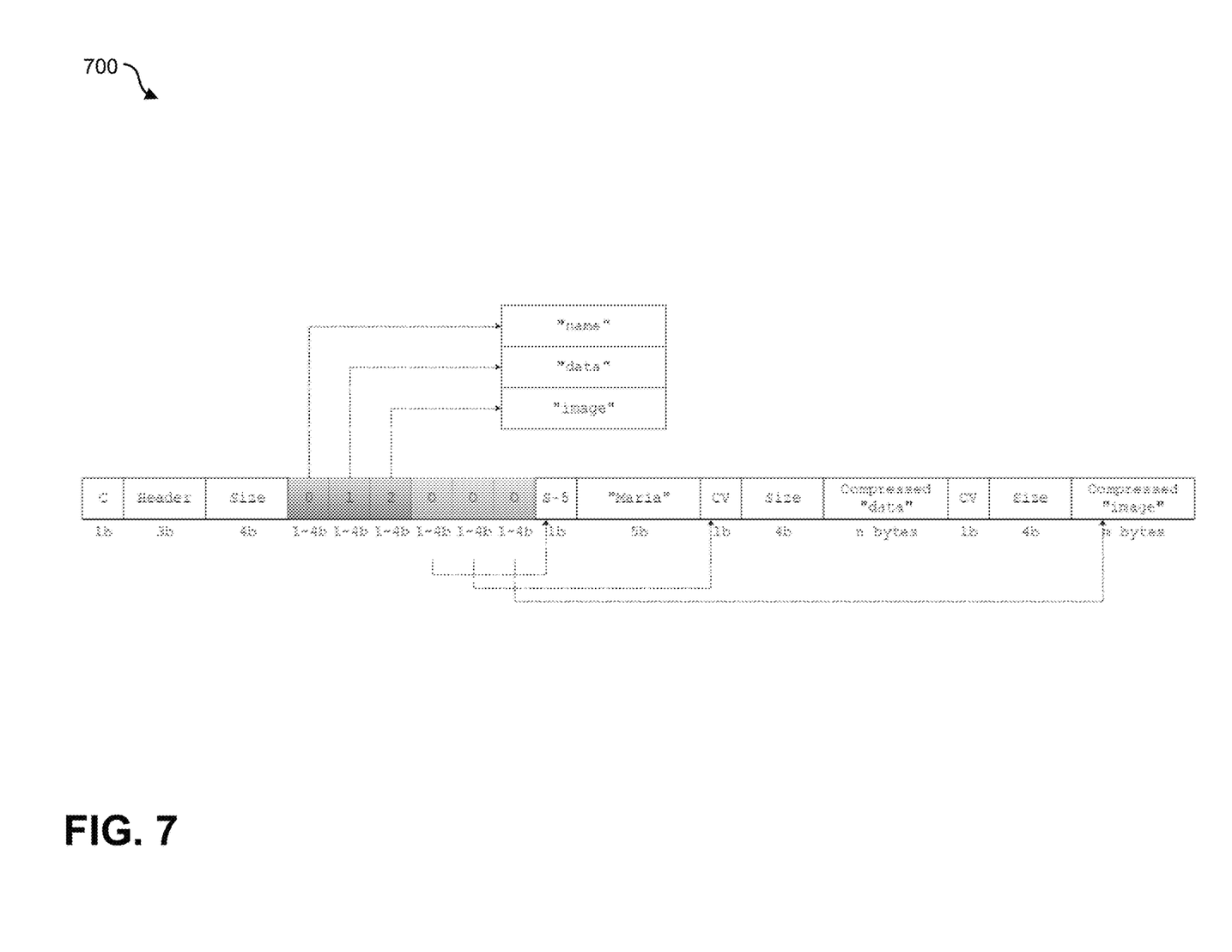
FIG. 7 is a third diagram of an object to illustrate partial object compression.

One disadvantage of combined compressions is that one always has to decompress the full inner object even if the only interest is a field of the inner object (e.g., image, etc.). With reference to diagram 700 of FIG. 7, each element can also be compressed separately.

Partial object compression can also be used for objects with many elements. For example, an object can have several thousand key-value pairs with only a few of the pairs being frequently accessed. This situation leads to offset arrays and ValueID arrays having several thousand entries. So each time a key within this object is to be identified, a very long array needs to be scanned. Such scanning can take a large amount of time and consume various resources (e.g., processors, memory, etc.) while skipping many locations within the objects.

To improve this situation, the combined compression arrangement can be modified given that the inner object can often contain rarely accessed elements. Instead of having the huge offset and ValueID array in the outer object, only the offset and ValueID values of the elements which are not in the inner compressed object can be stored. Additionally, one more element can be added to the offset array that points to the compressed inner object. A marker can be added to the header of the outer object which can be used to identify that there is an additional entry at the end of the offset array which points to the compressed inner object.

When comparing this arrangement the regular combined compression solution, the outer offset array and ValueID array contain now only entries for elements which are not in the inner compressed object. Only the very last additional offset points to the inner compressed object.

So, with this arrangement, to find a value, the ValueID array is first scanned. If the ValueID array is not found in the outer ValueID array, the header is checked to see if the bit is set for an additional inner compressed object. If this bit is set, the additional offset is read, the address of the additional offset is calculated and decompressed, the key in the inner now uncompressed object is searched for. The key is either found in this location or not at all.

When comparing values of different PJSON types, the following order from lowest to highest can be used:
1. null
2. Numbers: int8, uint8, int16, int32, int64, float32 and float64
3. Boolean
4. Object
5. Array
6. ObjectID PJSON can treat some types as equivalent for comparison purposes. For instance, numeric types undergo conversion before comparison. The comparison treats a non-existent field as it would an empty PJSON Object. As such, a sort on the a field in documents { } and {a: null} would treat the documents as equivalent in sort order.

With arrays, a less-than comparison or an ascending sort compares the smallest element of arrays, and a greater-than comparison or a descending sort compares the largest element of the arrays. As such, when comparing a field whose value is a single-element array (e.g. [1]) with non-array fields (e.g. 2), the comparison is between 1 and 2. A comparison of an empty array (e.g. [ ]) treats the empty array as less than null or a missing field.

Missing values can be considered as null in comparison. Therefore two missing values can be considered equal, or a missing value is equal to null value. The comparisons below hold:

Missing Value==Missing Value
Null Value==Missing Value
Considering the collection with documents:
{_id: 1, age: 2},
{_id: 2, age: 1, name: "joe", surname: "dalton"},
{_id: 3, age: 3, name: "john", surname: "john"},
{_id: 4, age: 5, name: "kate", surname: null},
{_id: 5, age: 2, name: "helen"},
{_id: 6, age: 6, name: null, surname: null},
{_id: 7, age: 9, name: null}
select * from a where name=surname;

{_id: 1, age: 4}
{_id: 3, age: 3, name: "john", surname: "john"}
{_id: 6, age: 6, name: null, surname: null}
{_id: 7, age: 9, name: null}

Object comparison is done by comparing fields (including keys and values) of the objects respectively. Therefore, the names and order of fields in an object can matters:

{name: "John", age: 30, id: 11}
{name: "John", id: 11, age: 30}

Notice that the two above objects are not equal given that the order of fields matter. The comparison returns the lexicographical comparison of strings "age" and "id" which differ.

Figure 8:
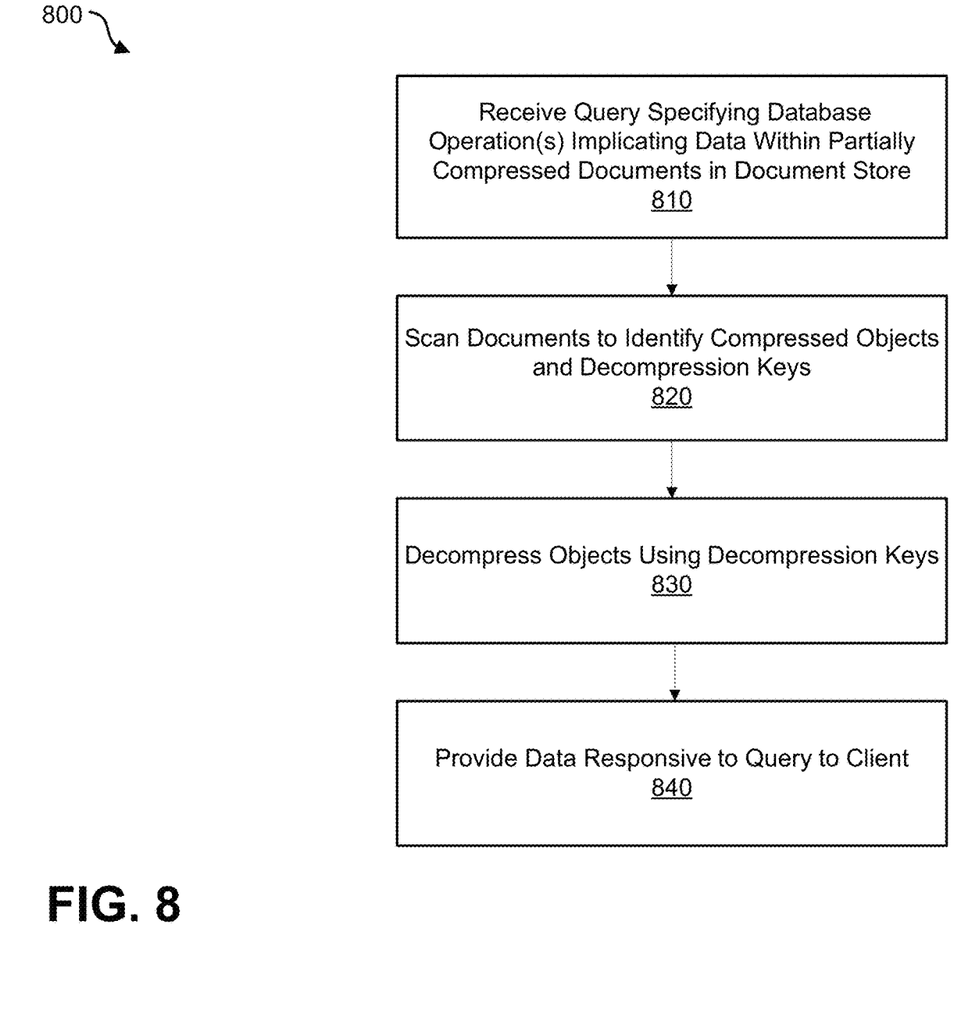
FIG. 8 is a process flow diagram illustrating execution of queries of a document store employing partial object compression.

FIG. 8 is a process flow diagram 800 in which, at 810, a query is received by a document store from a client that specifies at least one database operation implicating documents within the document store. At least one of the implicated documents has partially compressed objects in which only a portion of the document is compressed. Thereafter, at 820, the documents are scanned to identify the compressed objects and to identify decompression keys. Then, at 830, the scanned compressed objects are decompressed using the corresponding decompression keys. Optionally, at 840, data responsive to the query is provided to the client.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein may be implemented on a computer having a display device (e.g., a CRT (cathode ray tube) or LCD (liquid crystal display) monitor) for displaying information to the user and a keyboard and a pointing device (e.g., a mouse or a trackball) and/or a touchscreen by which the user may provide input to the computer. Other kinds of devices may be used to provide for interaction with a user as well; for example, feedback provided to the user may be any form of sensory feedback (e.g., visual feedback, auditory feedback, or tactile feedback); and input from the user may be received in any form, including acoustic, speech, or tactile input.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method comprising:
receiving, from a client by a document store, a query specifying at least one database operation implicating documents within the document store, at least one of the implicated documents having partially compressed objects in which only a portion of the document is compressed;
scanning the documents to identify the compressed objects and to identify decompression keys, the scanning comprising first scanning an outer object of a partially compressed object with entries corresponding to more frequently accessed entries and, if no matches are found within a corresponding array, checking a header of the partially compressed object to determine that a bit is set indicating that there is an additional inner compressed object, reading an additional offset in the outer object, calculating and decompressing an address of the additional offset, subsequently searching, based on the decompressed address of the additional offset, the inner compressed object with more entries than the outer object corresponding to rarely accessed entries, the second scanning requiring more time than the first scanning;

decompressing the scanned compressed objects using the corresponding decompression keys; and providing data responsive to the query to the client.

2. The method of claim 1, wherein there is a first database and a second database, the second database comprising the document store.

3. The method of claim 2, wherein the query implicates data in both of the first database and the second database.

4. The method of claim 3 further comprising:
initiating a plurality of transactions responsive to the query to access the data within the first database and the second database; and
coordinating execution of the plurality of transactions between the first database and the second database.

5. The method of claim 4 further comprising:
notifying, by a transaction manager of the second database to a transaction manager of the first database, changes specified by the at least one database operation in the first database; and
persisting all changes specified by the at least one database operation in the first database including changes implicating data stored within the second database.

6. The method of claim 5, wherein the first database is an in-memory relational database and the second database is a database storing data on physical disk storage.

7. The method of claim 6, wherein the document store stores a collection of documents in JavaScript Object Notation (JSON) format.

8. A system comprising:
at least one data processor; and
memory storing instructions which, when executed by the at least one data processor, result in operations comprising:
receiving, from a client by a document store, a query specifying at least one database operation implicating documents within the document store, at least one of the implicated documents having partially compressed objects in which only a portion of the document is compressed;
scanning the documents to identify the compressed objects and to identify decompression keys, the scanning comprising first scanning an outer object of a partially compressed object with entries corresponding to more frequently accessed entries and, if no matches are found within a corresponding array, checking a header of the partially compressed object to determine that a bit is set indicating that there is an additional inner compressed object, reading an additional offset in the outer object, calculating and decompressing an address of the additional offset, subsequently scanning, based on the decompressed address of the additional offset, the inner compressed object with more entries than the outer object corresponding to rarely accessed entries, the second scanning requiring more time than the first scanning;
decompressing the scanned compressed objects using the corresponding decompression keys; and
providing data responsive to the query to the client.

9. The system of claim 8, wherein there is a first database and a second database, the second database comprising the document store.

10. The system of claim 9, wherein the query implicates data in both of the first database and the second database.

11. The system of claim 9, wherein the operations further comprise:
initiating a plurality of transactions responsive to the query to access the data within the first database and the second database; and
coordinating execution of the plurality of transactions between the first database and the second database.

12. The system of claim 11, wherein the operations further comprise:
notifying, by a transaction manager of the second database to a transaction manager of the first database, changes specified by the at least one database operation in the first database; and
persisting all changes specified by the at least one database operation in the first database including changes implicating data stored within the second database.

13. The system of claim 12, wherein the first database is an in-memory relational database and the second database is a database storing data on physical disk storage.

14. The system of claim 13, wherein the document store stores a collection of documents in JavaScript Object Notation (JSON) format.

15. A non-transitory computer program product storing instructions which, when executed by at least one data processor forming part of at least one computing device, result in operations comprising:
receiving, from a client, a single query specifying at least one database operation implicating documents within both of a first database and a second database having a document store, at least one of the implicated documents having partially compressed objects in which only a portion of the document is compressed, the document store storing a collection of documents in JavaScript Object Notation (JSON) format;
scanning the documents to identify the compressed objects and to identify decompression keys, the scanning comprising first scanning an outer object of a partially compressed object with entries corresponding to more frequently accessed entries and, if no matches are found within a corresponding array, checking a header of the partially compressed object to determine that a bit is set indicating that there is an additional inner compressed object, reading an additional offset in the outer object, calculating and decompressing an address of the additional offset, subsequently scanning, based on the decompressed address of the additional offset, the inner compressed object with more entries than the outer object corresponding to rarely accessed entries, the second scanning requiring more time than the first scanning;
decompressing the scanned compressed objects using the corresponding decompression keys; and
providing data responsive to the query and obtained from both of the first and second databases to the client.

16. The computer program product of claim 15, wherein the operations further comprise:

initiating a plurality of transactions responsive to the query to access the data within the first database and the second database; and coordinating execution of the plurality of transactions between the first database and the second database.

17. The computer program product of claim 16, wherein the operations further comprise:

persisting all changes specified by the at least one database operation in the first database including changes implicating data stored within the second database.

18. The computer program product of claim 17, wherein the first database is an in-memory relational database and the second database is a database storing data on physical disk storage.

19. The method of claim 1, wherein the inner compressed object comprises an image and the outer compressed object comprises metadata characterizing the image.

20. The system of claim 8, wherein the inner compressed object comprises an image and the outer compressed object comprises metadata characterizing the image.

* * * * *